(12) United States Patent
Loibl

(10) Patent No.: US 10,134,452 B2
(45) Date of Patent: Nov. 20, 2018

(54) MEMORY ARRANGEMENT AND METHOD FOR READING A MEMORY CELL OF A MEMORY

(71) Applicant: Infineon Technologies AG, Neubiberg (DE)

(72) Inventor: Ulrich Loibl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/421,475

(22) Filed: Feb. 1, 2017

(65) Prior Publication Data
US 2017/0270978 A1   Sep. 21, 2017

(30) Foreign Application Priority Data

Mar. 17, 2016   (DE) .................. 10 2016 104 987

(51) Int. Cl.
| | |
|---|---|
| *G11C 11/16* | (2006.01) |
| *G11C 16/26* | (2006.01) |
| *G11C 7/08* | (2006.01) |
| *G11C 13/00* | (2006.01) |
| *G11C 7/06* | (2006.01) |

(52) U.S. Cl.
CPC ............ *G11C 7/08* (2013.01); *G11C 11/1673* (2013.01); *G11C 13/004* (2013.01); *G11C 16/26* (2013.01); *G11C 7/067* (2013.01); *G11C 2013/0045* (2013.01); *G11C 2013/0054* (2013.01); *G11C 2207/063* (2013.01)

(58) Field of Classification Search
CPC ....... G11C 16/10; G11C 7/12; G11C 11/4074; G11C 16/24; G11C 11/4093; G11C 11/4096; G11C 5/147; G11C 7/1078; G11C 7/222
See application file for complete search history.

(56) References Cited

U.S. PATENT DOCUMENTS

| | | | | |
|---|---|---|---|---|
| 5,390,147 | A * | 2/1995 | Smarandoiu ........... | G11C 7/062 365/185.11 |
| 2007/0164791 | A1* | 7/2007 | Rao ...................... | H03K 5/2472 327/77 |
| 2010/0039171 | A1* | 2/2010 | Tsukada ................... | G11C 7/12 327/540 |

(Continued)

FOREIGN PATENT DOCUMENTS

| | | |
|---|---|---|
| DE | 69422915 T2 | 10/2000 |
| WO | 9524040 A1 | 9/1995 |

*Primary Examiner* — Hien Nguyen
(74) *Attorney, Agent, or Firm* — Viering, Jentschura & Partner mbB

(57) ABSTRACT

According to one embodiment, a memory arrangement is described a memory including a memory cell and a sense amplifier coupled to the memory cell having a node whose potential depends on the difference between a current through the memory cell and a reference current, a detection circuit configured to generate a signal representing whether the current through the memory cell is above or below the reference current based on the potential of the node and a limitation circuit configured to receive the signal and to limit the change of the potential of the node caused by the difference between the current through the memory cell and the reference current in response to the signal.

23 Claims, 14 Drawing Sheets

(56) References Cited

U.S. PATENT DOCUMENTS

2012/0314510 A1* 12/2012 Ikeda .................. G11C 7/1048
365/189.05
2013/0088911 A1* 4/2013 Nakura .............. G11C 13/0002
365/148

* cited by examiner

MEMORY ARRANGEMENT AND METHOD FOR READING A MEMORY CELL OF A MEMORY

CROSS-REFERENCE TO RELATED APPLICATION

This application claims priority to German Patent Application Serial No. 10 2016 104 987.5, which was filed Mar. 17, 2016, and is incorporated herein by reference in its entirety.

TECHNICAL FIELD

The present disclosure relates to memory arrangements and methods for reading a memory cell of a memory.

BACKGROUND

Sense amplifiers are used as sensing elements to detect the cell status in a memory array field, e.g. in a flash memory. There is an increasing demand for performance improvements such as latency reduction and power reduction.

SUMMARY

According to one embodiment, a memory arrangement is provided including a memory including a memory cell and a sense amplifier coupled to the memory cell including a node whose potential depends on the difference between a current through the memory cell and a reference current, a detection circuit configured to generate a signal representing whether the current through the memory cell is above or below the reference current based on the potential of the node and a limitation circuit configured to receive the signal and to limit the change of the potential of the node caused by the difference between the current through the memory cell and the reference current in response to the signal.

According to a further embodiment, a method for reading a memory cell of a memory according to the memory arrangement described above is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
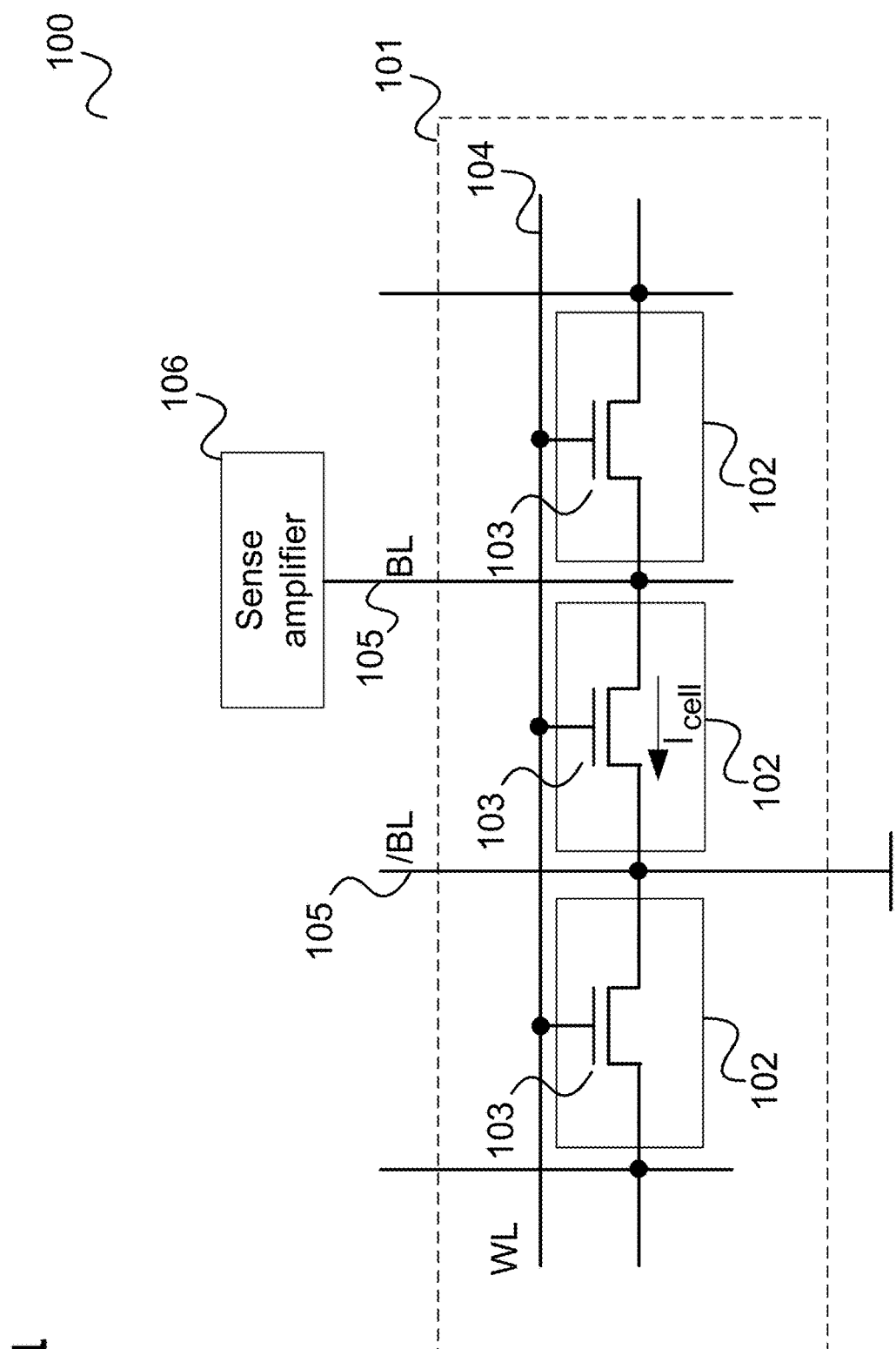
FIG. 1 shows a memory arrangement.

FIG. 1 shows a memory arrangement 100.

The memory arrangement 100 shows a memory array 101 including non-volatile memory cells 102. Each memory cell 102 has a field effect transistor 103 whose gate is connected to a word line 104 and which is connected with its source and drain between two complementary bit lines 105. The memory cells 102 are for example MRAM (magnetoresistive random access memory) or RRAM (resistive RAM) cells and may accordingly include further components e.g. a magnetic tunnel junction connected between the bit line and the field effect transistor 103.

For example, the middle memory cell 102 is connected to the right to a bit line BL and to the left to a bit line /BL.

For reading out the middle memory cell 102, a sense amplifier 106 is connected to the bit line BL, the complementary bit line /BL is connected to ground. Depending on the state of the middle memory cell 102, i.e. depending on whether it stores a logical 0 or a logical 1, the current through the cell $I_{cell}$ has a higher value or a lower value. The sense amplifier 106 detects the size of this cell current $I_{cell}$, e.g. by comparing it with a reference current $I_{ref}$ and outputs a detection result i.e. a binary signal indicating whether the middle memory cell 102 stores a 0 or a 1.

Figure 2:
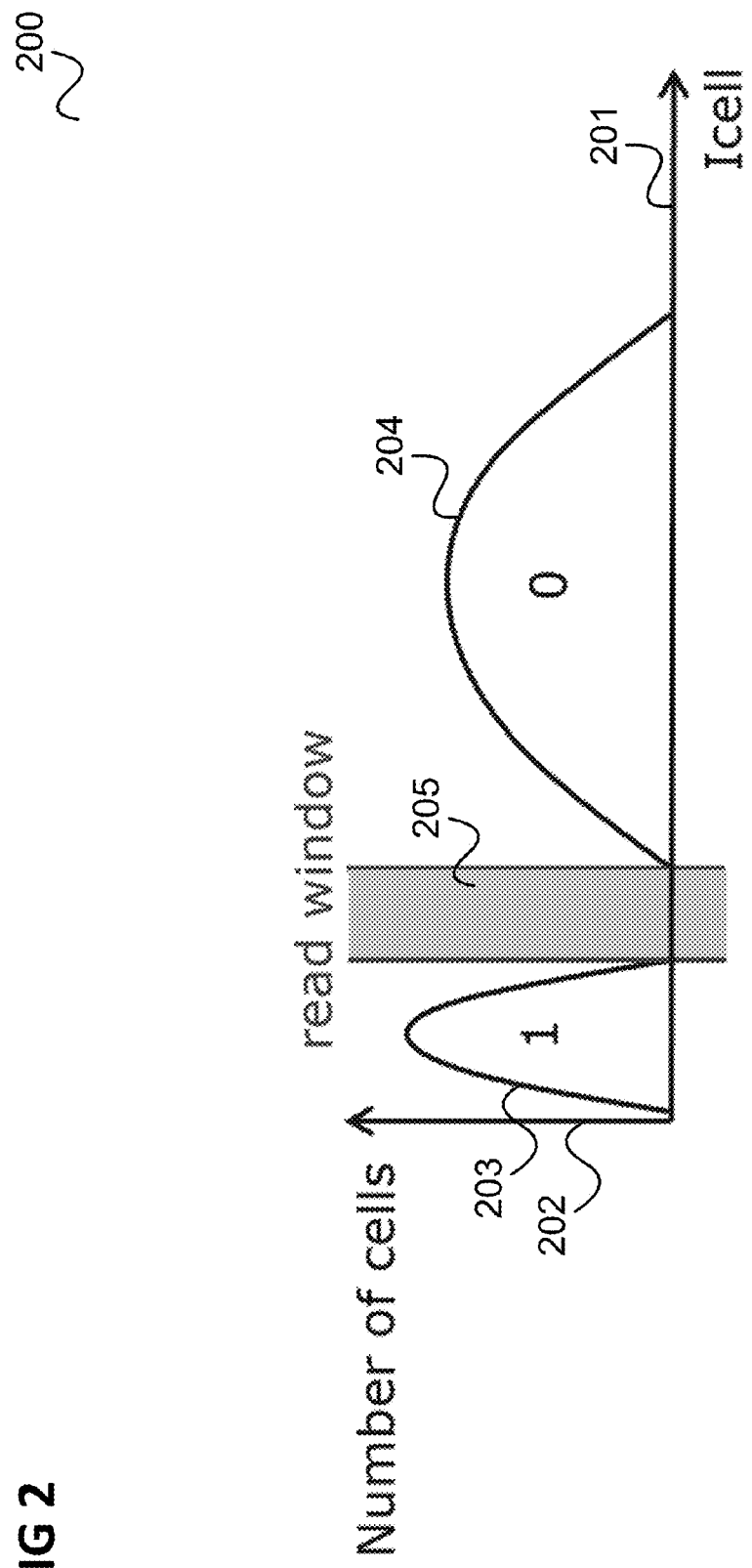
FIG. 2 illustrates the distribution of the memory cell current for the two logical cell states.

FIG. 2 illustrates the distribution of the cell current $I_{cell}$ for the two logical cell states.

The cell current increases from left to right along the horizontal axis 201 and the number of cells having a certain current for a certain logical state increases from bottom to top along the vertical axis 202.

A first curve 203 shows for each cell current the number of cells having the cell current when the logical state is 1 and a second curve 204 shows for each cell current the number of cells having the cell current when the logical state is 0. As can be seen, there is a region, called the read window 205, where both curves are zero, i.e. there is a range of cell currents which no cell ever has. This read window allows deciding between the logical states when reading out a memory cell 102.

The sense amplifier 106 (SA) can be seen as the key element for reading out the memory cells 102, i.e. for obtaining the stored digital information (1 or 0) in case the read window is small in shortest possible time.

Sense amplifiers differ in speed, accuracy, area and power consumption where typically, one property can be optimized at the expense of the others.

The basic function of the sense amplifier 106 is to provide a dedicated voltage to, in the example of FIG. 1, the middle memory cell 102 and detect the cell state in form of current or slew rate if the cell current is integrated, i.e. two types of sense amplifiers can be differentiated:

1) Current domain sense amplifier (based on comparison of the cell current with a reference current): This allows a high resolution since a precise comparison of the cell current and the reference current is possible. Further, it does not require synchronization. However, a distribution of the reference current to the sense amplifiers is necessary and it typically has a high power dissipation especially if a comparator circuit for the bit line voltage is used to increase speed.

2) Time domain sense amplifier (based on comparison of slew rate of the charging of a capacitor with a reference): This allows a fast detection with low power dissipation. However, reference cells or bit lines (e.g. as capacity to be charged) as well as the precharge timing are needed. Further, the evaluation of different slew rates is difficult to handle and subject to clean signal distributions.

In the following, an approach is described which allows combining speed, accuracy, area and power consumption in a balanced way and is in particular well suitable for the emerging memories such as MRAM and RRAM which typically have very low read window.

Figure 3:
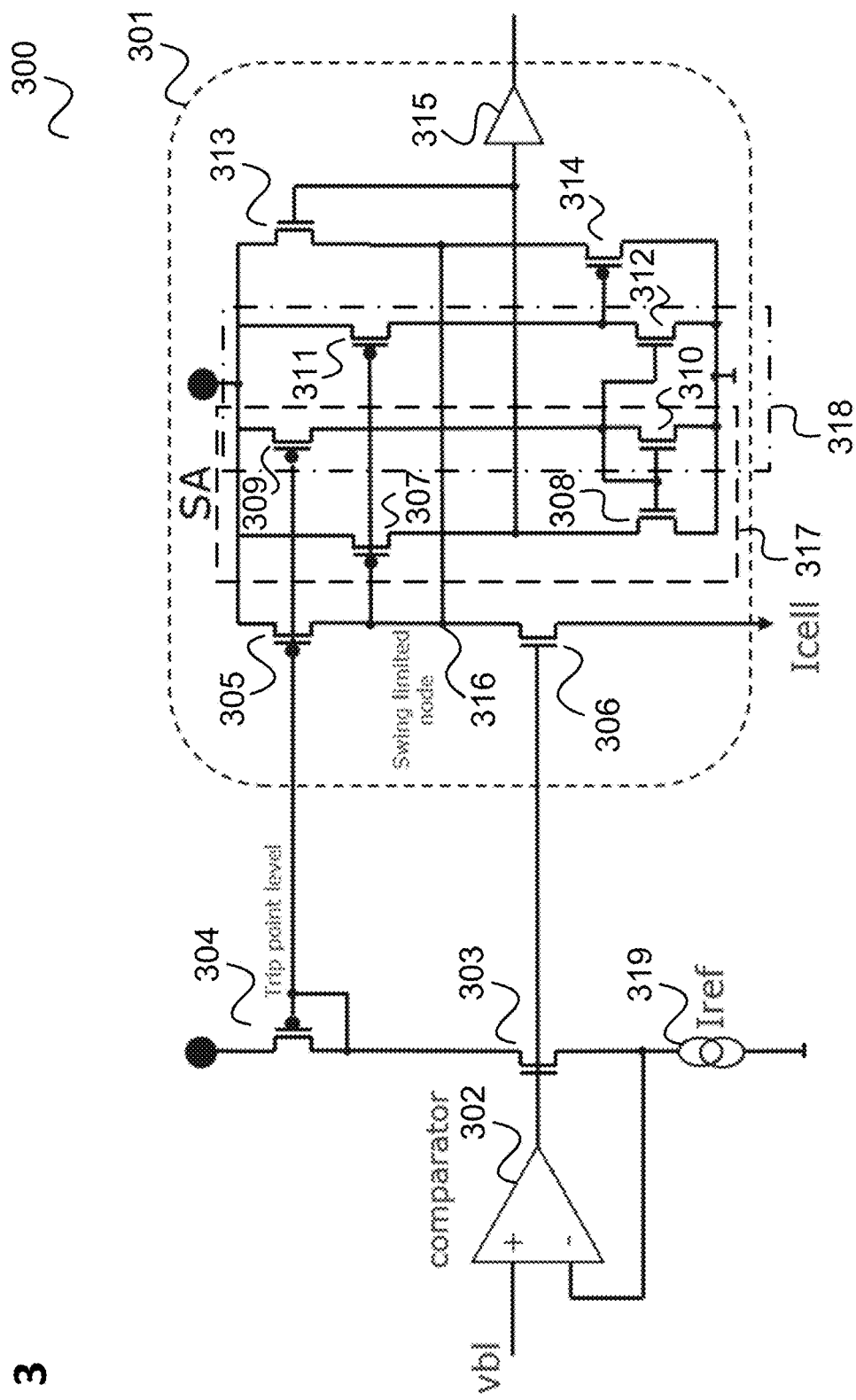
FIG. 3 shows a sense amplifier arrangement according to an embodiment.

FIG. 3 shows a sense amplifier arrangement 300 according to an embodiment.

The sense amplifier arrangement 300 includes the sense amplifier 301 and a comparator 302 which receives the bit line voltage vbl at its positive input and whose output is connected to the gate of a first n channel field effect transistor 303 whose source is connected to the negative input of the comparator 302 and to one terminal of a current source 319 whose other terminal (ground terminal) is connected to ground which provides a current in the direction to the ground terminal. The drain of the first n channel field effect transistor 303 is connected to the drain of the first p channel field effect transistor 304 whose source is connected to a high supply potential and whose gate is connected to its drain.

The sense amplifier 301 includes a second p channel field effect transistor 305 whose gate is connected to the gate of the first p channel field effect transistor 304, whose source is connected to the high supply potential and whose drain is connected to the drain of a second n channel field effect transistor 306 whose source is connected to the cell output of the sense amplifier 301 which is connected to the bit line of the memory cell to be read. The sense amplifier 301 further includes a third p channel field effect transistor 307 whose source is connected to the high supply potential, whose gate is connected to the drain of the second p channel field effect transistor 305 and whose drain is connected to the drain of a third n channel field effect transistor 308 whose source is connected to ground.

Further, the sense amplifier 301 includes a fourth p channel field effect transistor 309 whose source is connected to the high supply potential, whose gate is connected to the gate of the second p channel field effect transistor 305 and whose drain is connected to the drain of a fourth n channel field effect transistor 310 whose source is connected to ground and whose gate is connected to its drain and to the gate of the third n channel field effect transistor 308.

The sense amplifier 301 further includes a fifth p channel field effect transistor 311 whose source is connected to the high supply potential, whose gate is connected to the drain of the second p channel field effect transistor 305 and whose drain is connected to the drain of a fifth n channel field effect transistor 312 whose source is connected to ground and whose gate is connected to the drain of the fourth n channel field effect transistor 310.

The sense amplifier further includes a sixth n channel field effect transistor 313 whose drain is connected to the high supply potential and whose source is connected to the source of sixth p channel field effect transistor 314, whose gate is connected to the drain of the fifth n channel field effect transistor 312 and whose drain is connected to ground.

The sense amplifier 301 further includes an amplifier 315 (e.g. an inverter) whose input is connected to the drain of the third p channel field effect transistor 307 and the gate of the sixth n channel field effect transistor 313 and whose output forms the output signal of the sense amplifier 301. The logical state of the output signal indicates whether the sense amplifier 301 has decided that a logical 0 has been read or that a logical 1 has been read.

The first p channel field effect transistor 304 and the second p channel field effect transistor 305 form a current mirror.

The comparator 302 and the current source 319 set the potential at the gates of the first p channel field effect transistor 304 and the second p channel field effect transistors 305 to what is in the following referred to as trip point level.

The node of connection between the drain of the second p channel field effect transistor 305, the gate of the third p channel field effect transistor 307, the drain of the second n field effect transistor 305, the source of the sixth n channel field effect transistor 313 and the source of the sixth p channel field effect transistor 314 is in the following referred to as (swing limited) node 316.

The third p channel field effect transistor 307, the fourth p channel field effect transistor 309, the third n channel field effect transistor 308 and the fourth n channel field effect transistor 310 form a first differential amplifier 317 which compares the potential of the node 316 with the trip point level and whose output is connected to the amplifier 315.

The fifth p channel field effect transistor 311, the fourth p channel field effect transistor 309, the fifth n channel field effect transistor 312 and the fourth n channel field effect transistor 310 form a second differential amplifier 318 which compares the potential of the node 316 with the trip point level and whose output is connected to the gate of the sixth p channel field effect transistor 314.

Figure 4:
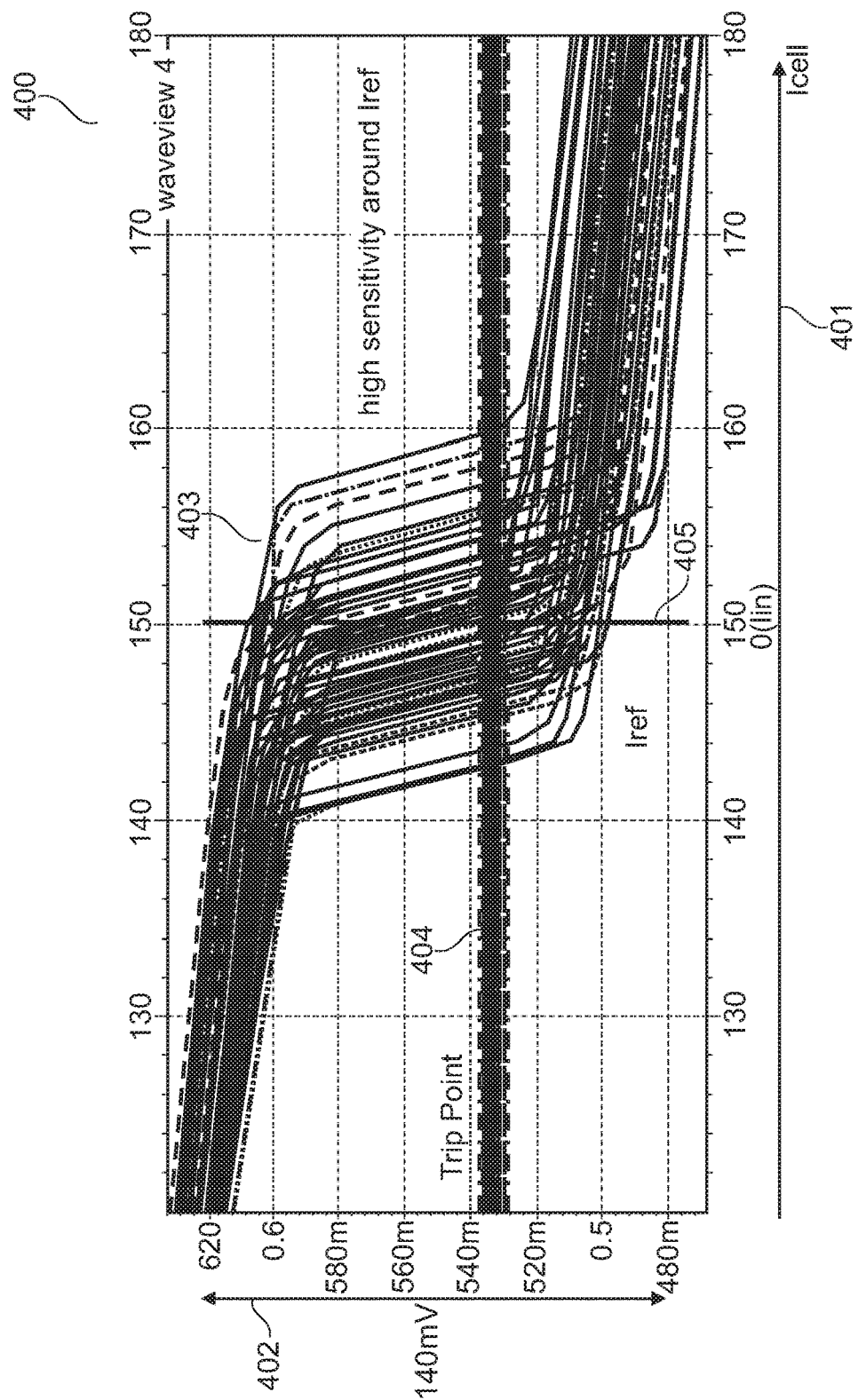
FIG. 4 shows a diagram illustrating the dependency of the potential at a node of the sense amplifier of FIG. 3 from the cell current.

FIG. 4 shows a diagram 400 illustrating the dependency of the potential at the node 316 from the cell current.

In FIG. 4, the cell current increases from left to right along the horizontal axis 401 and the potential at the node 316 increases from bottom to top along a vertical axis 402.

A set of curves 403 illustrates the dependency of the potential at the node 316 from the cell current for a various process variations which influence the behavior of the sense amplifier 301.

A horizontal line 404 indicates the trip point level and a vertical line 405 indicates the reference current.

As can be seen, for every process variation, the potential at the node 316 is very sensitive to the cell current around the reference current which allows a high resolution.

In the following, the behavior of the sense amplifier 301 will be explained four different cases with reference to FIGS. 5 to 10.

Figure 5:
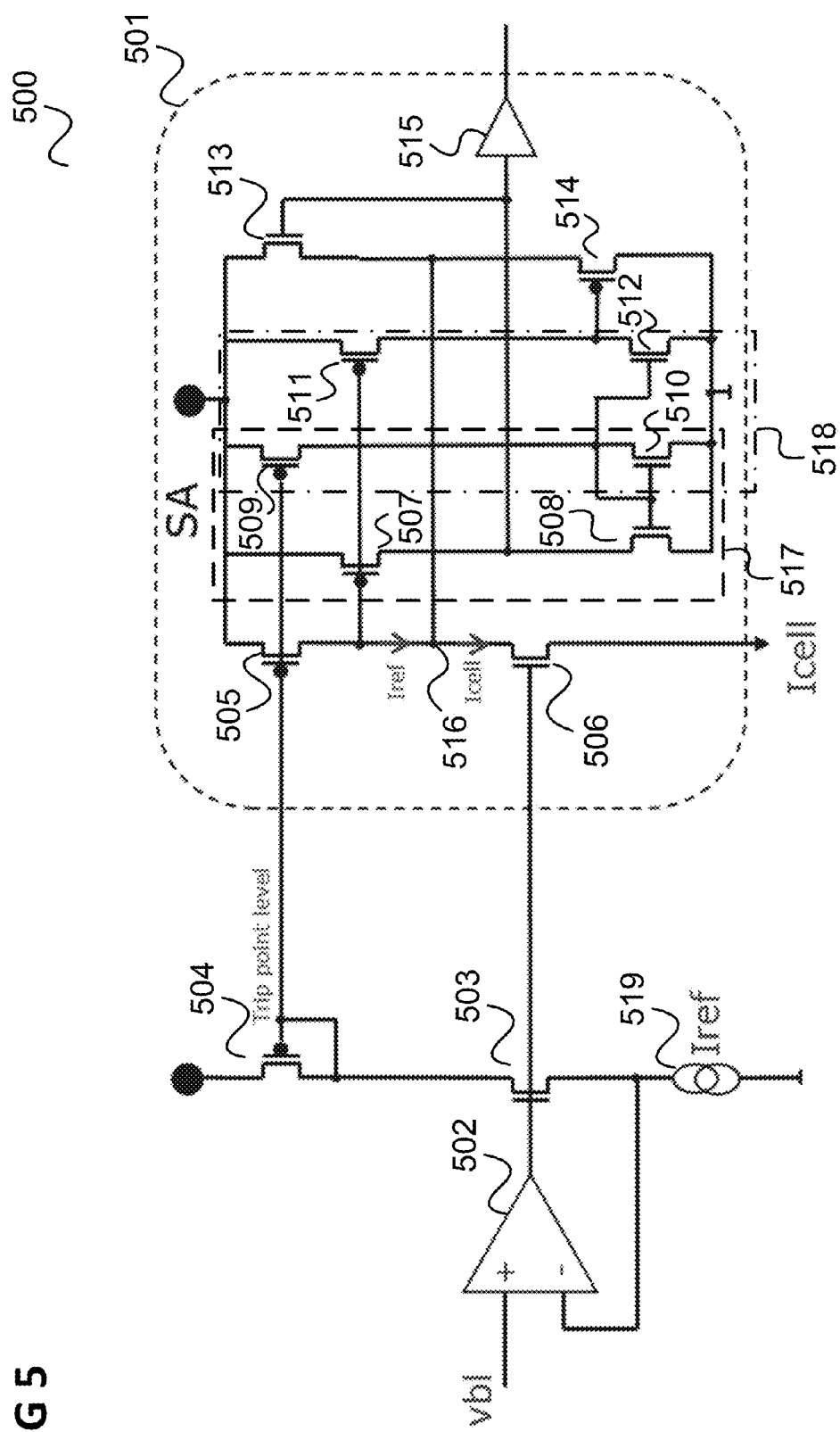
FIG. 5 shows a sense amplifier arrangement corresponding to the sense amplifier arrangement of FIG. 3 for the case that the cell current is close to the reference current.

FIG. 5 shows a sense amplifier arrangement 500 corresponding to the sense amplifier arrangement 300 for the case that the cell current is close to the reference current.

The sense amplifier arrangement 500 includes components 501 to 518 as explained with reference to FIG. 3.

Since the first p channel field effect transistor 504 and the second p channel field effect transistor 505 form a current mirror the reference current flows through the second p channel field effect transistor 505 to the node 516.

The cell current flows from the node 516 through the second n channel field effect transistor 506.

For the case that the cell current is close to the reference current the potential at the source of the second n channel field effect transistor 506 is set to be close to the bit line voltage vbl due to the feedback to the negative input of the comparator 502 and the connection of the gates of both the first n channel field effect transistor 503 and the second n channel field effect transistor 505 to the output of the comparator 502.

Depending on whether the cell current is higher or lower than the reference current the potential of the node 516 is lower or higher than the trip point level. The first differential amplifier 517 amplifies and inverts this difference and supplies a corresponding signal to the amplifier 515 which further amplifies the signal and provides an output thus indicating whether the cell current is higher or lower than the reference current and thus indicating whether the cell stores a logical 0 or a logical 1.

The differential amplifiers 517 and 518 are dimensioned such that for the case where the cell current is close to the reference current the outputs of the differential amplifiers 517 and 518 are not sufficient to turn on the sixth n channel field effect transistor 513 and the sixth p channel field effect transistor 514, respectively.

The sense amplifier 501 thus operates in the region where the potential at the node 516 strongly depends on the cell current.

Figure 6:
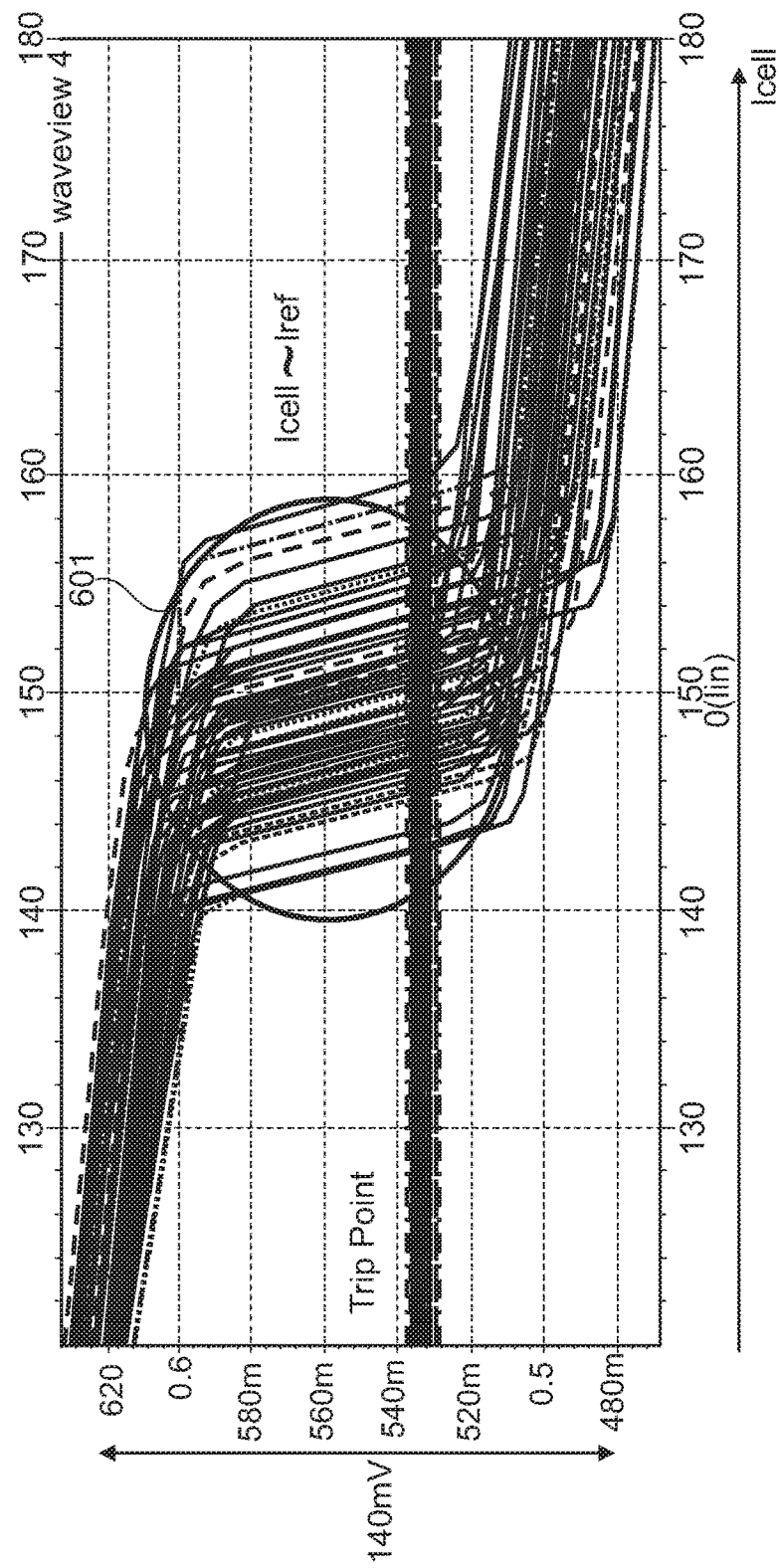
FIG. 6 illustrates the operating region for the case that the cell current is close to the reference current in the diagram of FIG. 4.

FIG. 6 illustrates the operating region 601 for the case that the cell current is close to the reference current in the diagram of FIG. 4.

Figure 7:
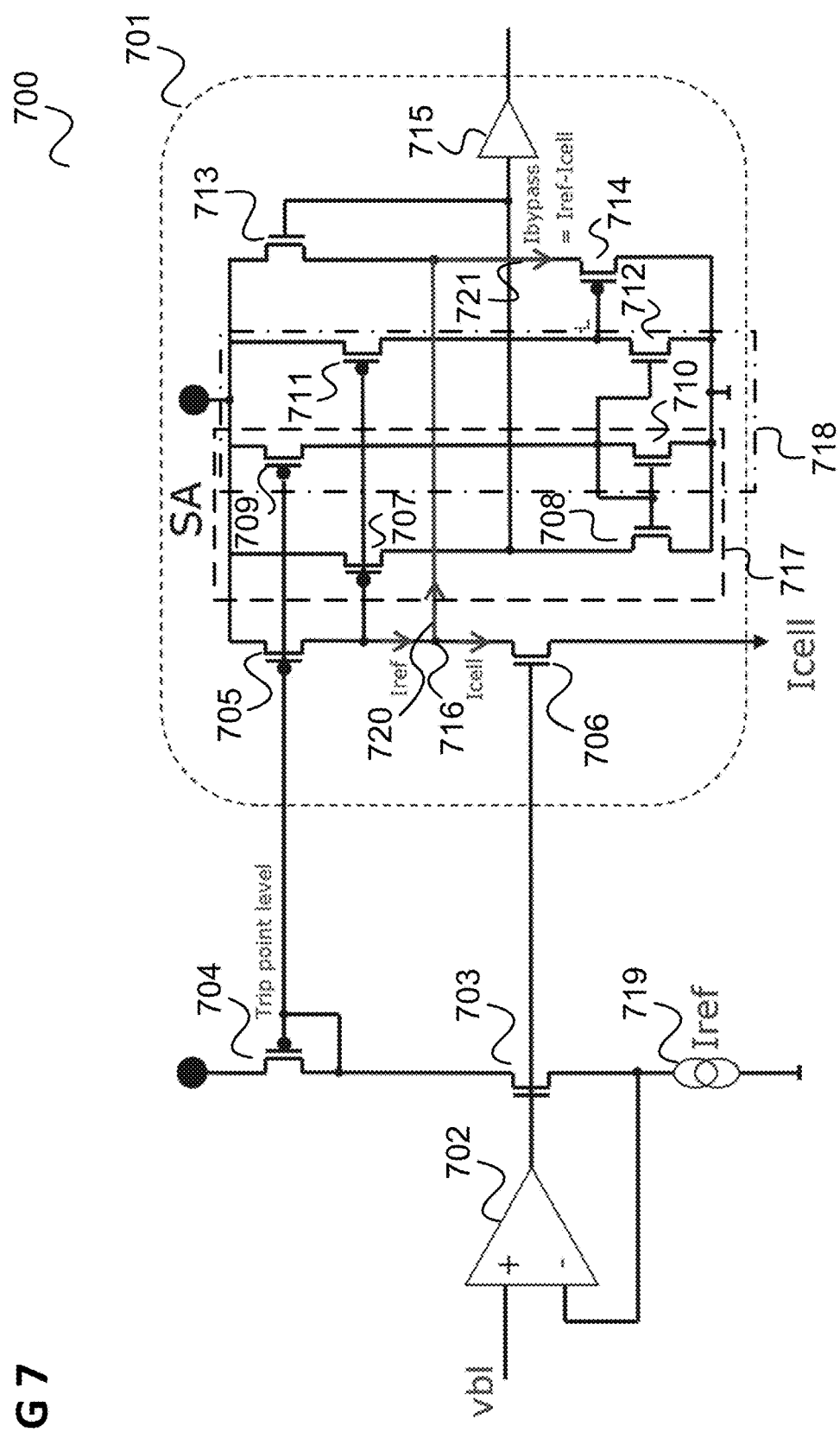
FIG. 7 shows a sense amplifier arrangement corresponding to the sense amplifier arrangement of FIG. 3 for the case that the cell current is much lower than the reference current.

FIG. 7 shows a sense amplifier arrangement 700 corresponding to the sense amplifier arrangement 300 for the case that the cell current is much lower than the reference current (to an extent that the sense amplifier 501 leaves the operation region 601).

The sense amplifier arrangement 700 includes components 701 to 718 as explained with reference to FIG. 3.

Since the first p channel field effect transistor 704 and the second p channel field effect transistor 705 form a current mirror the reference current flows through the second p channel field effect transistor 705 to the node 716.

The cell current flows from the node 716 through the second n channel field effect transistor 706.

For the case that the cell current is much lower than the reference current the potential at the source of the second n channel field effect transistor 706 rises above the bit line voltage vbl. Due to the higher voltage at the memory cell's bit line input, the cell current is thus higher than it would be with the normal bit line voltage vbl. However, in a qualitive manner, the condition still holds that the cell current is still much lower than the reference current.

Now that the cell current is lower than the reference current the potential of the node 716 is higher than the trip point level. The first differential amplifier 717 amplifies and inverts and supplies this amplified and inverted potential to the amplifier 715 which further amplifies it (and possibly again inverts it if the amplifier 715 is an inverter) and provides an output thus indicating that the cell current is lower than the reference current and thus indicating that, if the relation of cell current to stored value is for example like in FIG. 2, the cell stores a logical 1.

The low potential at the output of the first differential amplifier 717 switches off the sixth n channel field effect transistor 713.

The second differential amplifier 718 also outputs an amplified and inverted version of the potential at the node 716. The second differential amplifier 718 is dimensioned such that at a certain level of this amplified and inverted potential, e.g. when the potential of the node 716 leaves the operation region 601 indicated in FIG. 6, the amplified and inverted potential switches on the sixth p channel field effect transistor 714. This results in a bypass (in other words draining) of some of the reference current supplied to the node 716 through the sixth p channel field effect transistor 714 to ground (which is the stronger the higher the potential at node 716 gets) such that the potential at node 716 is limited. The bypass is indicated by arrows 720 and 721.

The sense amplifier 701 thus operates in the region where the dependence of the potential at the node 716 is weaker compared to the operation region 601 since the bypass through the sixth p channel field effect transistor 714 keeps it limited.

Figure 8:
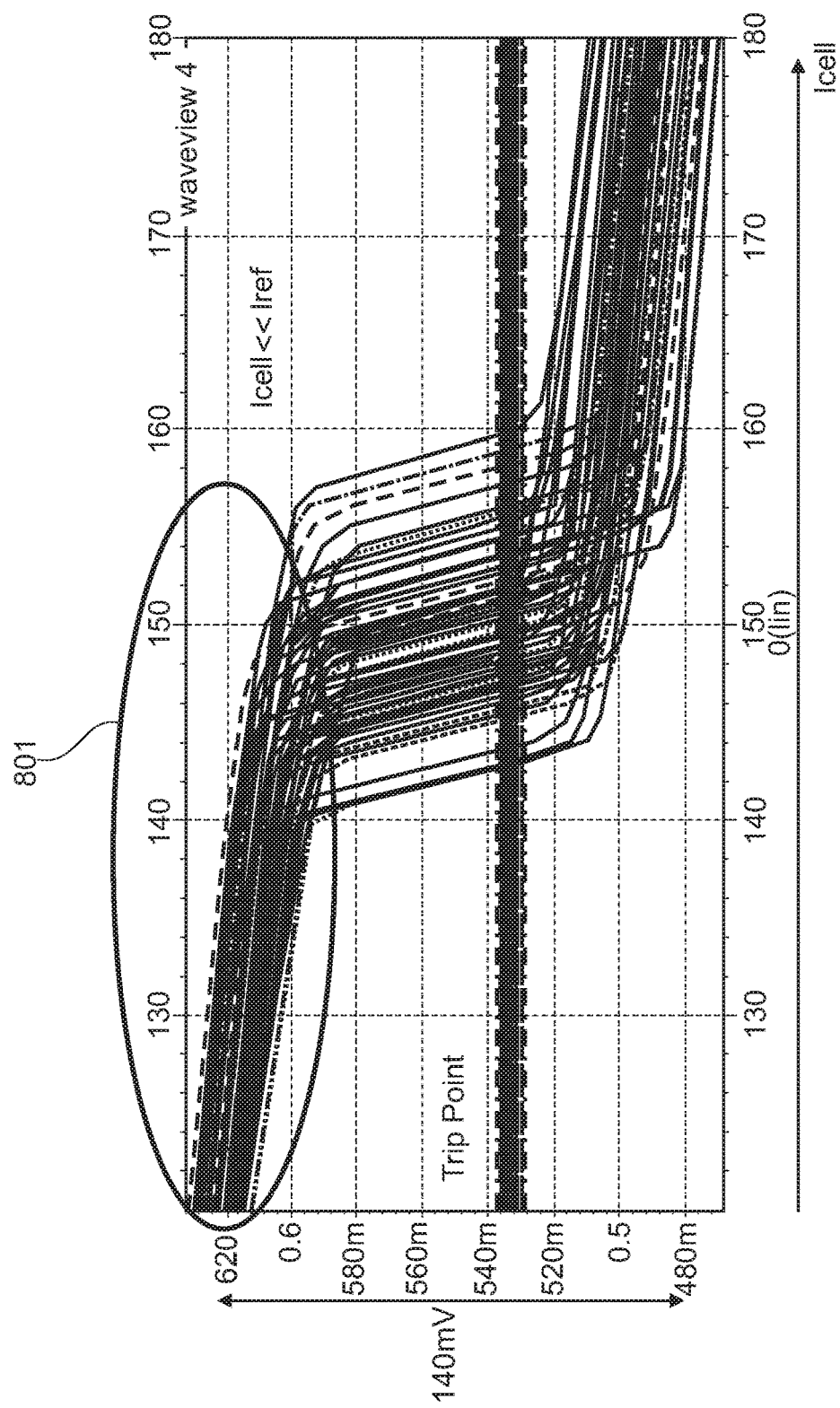
FIG. 8 illustrates the operating region of the sense amplifier for the case that the cell current is much lower than the reference current in the diagram of FIG. 4.

FIG. 8 illustrates the operating region 801 for the case that the cell current is much lower than the reference current in the diagram of FIG. 4.

Figure 9:
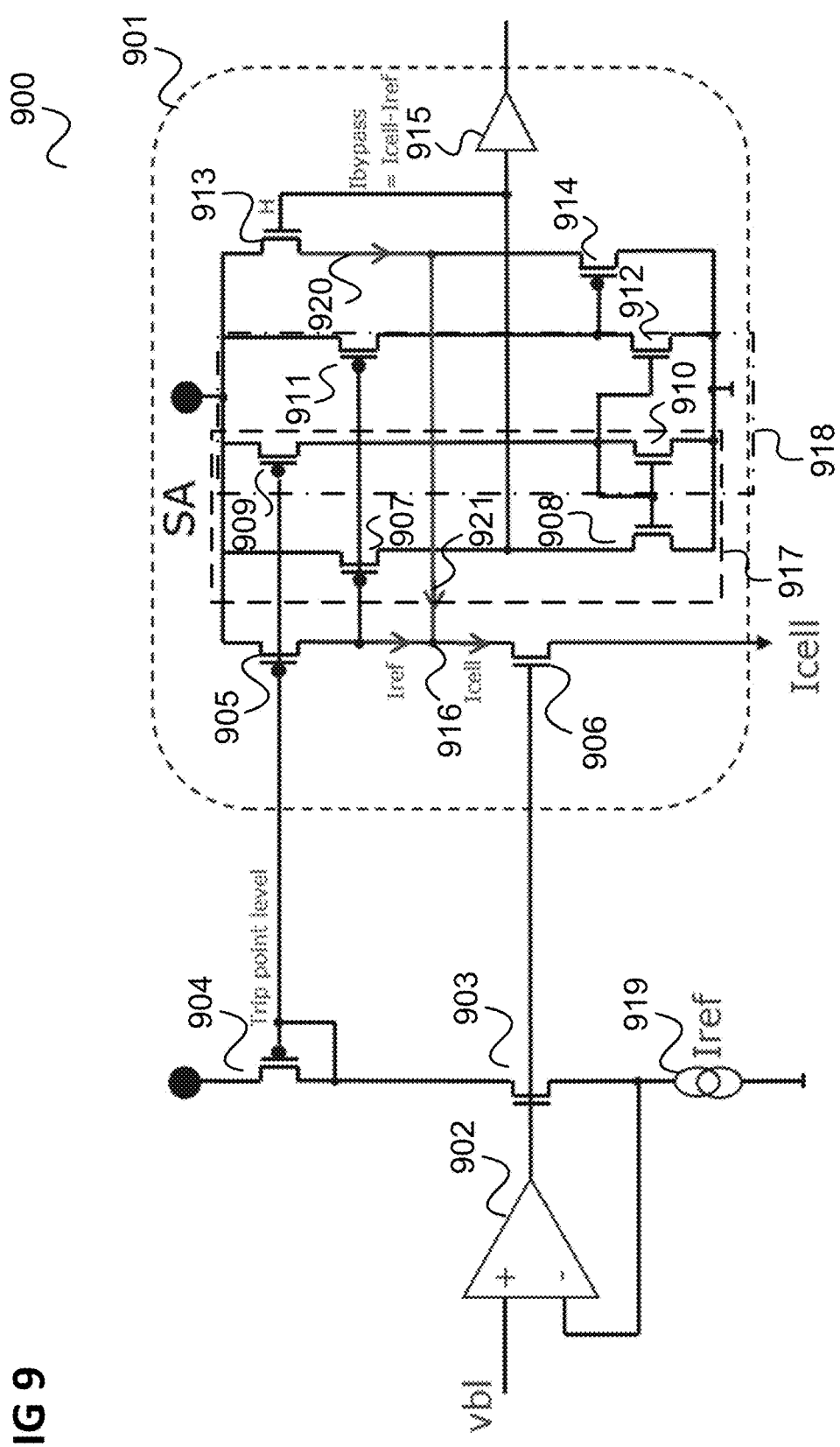
FIG. 9 shows a sense amplifier arrangement corresponding to the sense amplifier arrangement of FIG. 3 for the case that the cell current is much higher than the reference current.

FIG. 9 shows a sense amplifier arrangement 900 corresponding to the sense amplifier arrangement 300 for the case that the cell current is much higher than the reference current (to an extent that the sense amplifier 501 leaves the operation region 601).

The sense amplifier arrangement 900 includes components 901 to 918 as explained with reference to FIG. 3.

Since the first p channel field effect transistor 904 and the second p channel field effect transistor 905 form a current mirror the reference current flows through the second p channel field effect transistor 905 to the node 916.

The cell current flows from the node 916 through the second n channel field effect transistor 906.

For the case that the cell current is much higher than the reference current the potential at the source of the second n channel field effect transistor 906 falls below the bit line voltage vbl. Due to the lower voltage at the memory cell's bit line input, the cell current is thus lower than it would be with the normal bit line voltage vbl. However, in a qualitative manner, the condition still holds that the cell current is still much higher than the reference current.

Now that the cell current is higher than the reference current the potential of the node 916 is lower than the trip point level. The first differential amplifier 917 amplifies and inverts this potential and supplies the amplified and inverted potential to the amplifier 915 which generates a further amplified potential (and again inverts it if the amplifier 915 is an inverter) and provides an output thus indicating that the cell current is higher than the reference current and thus indicating that, if the relation of cell current to stored value is for example like in FIG. 2, the cell stores a logical 0.

The second differential amplifier 918 also outputs a low potential which switches off the sixth p channel field effect transistor 914.

The first differential amplifier 917 is dimensioned such that at a certain level of the high potential that it outputs, e.g. when the potential of the node 916 leaves the operation region 601 indicated in FIG. 6, its output potential switches on the sixth n channel field effect transistor 913. This results in a supply of current from the high supply potential through the sixth n channel field effect transistor 913 to node 916 (which is the stronger the lower the potential at node 916 gets) such that the potential at node 916 is limited from below.

The sense amplifier 901 thus operates in the region where the dependence of the potential at the node 916 is weaker compared to the operation region 601 since the supply through the sixth n channel field effect transistor 913 keeps it limited from below. The supply is indicated by arrows 920 and 921.

Figure 10:
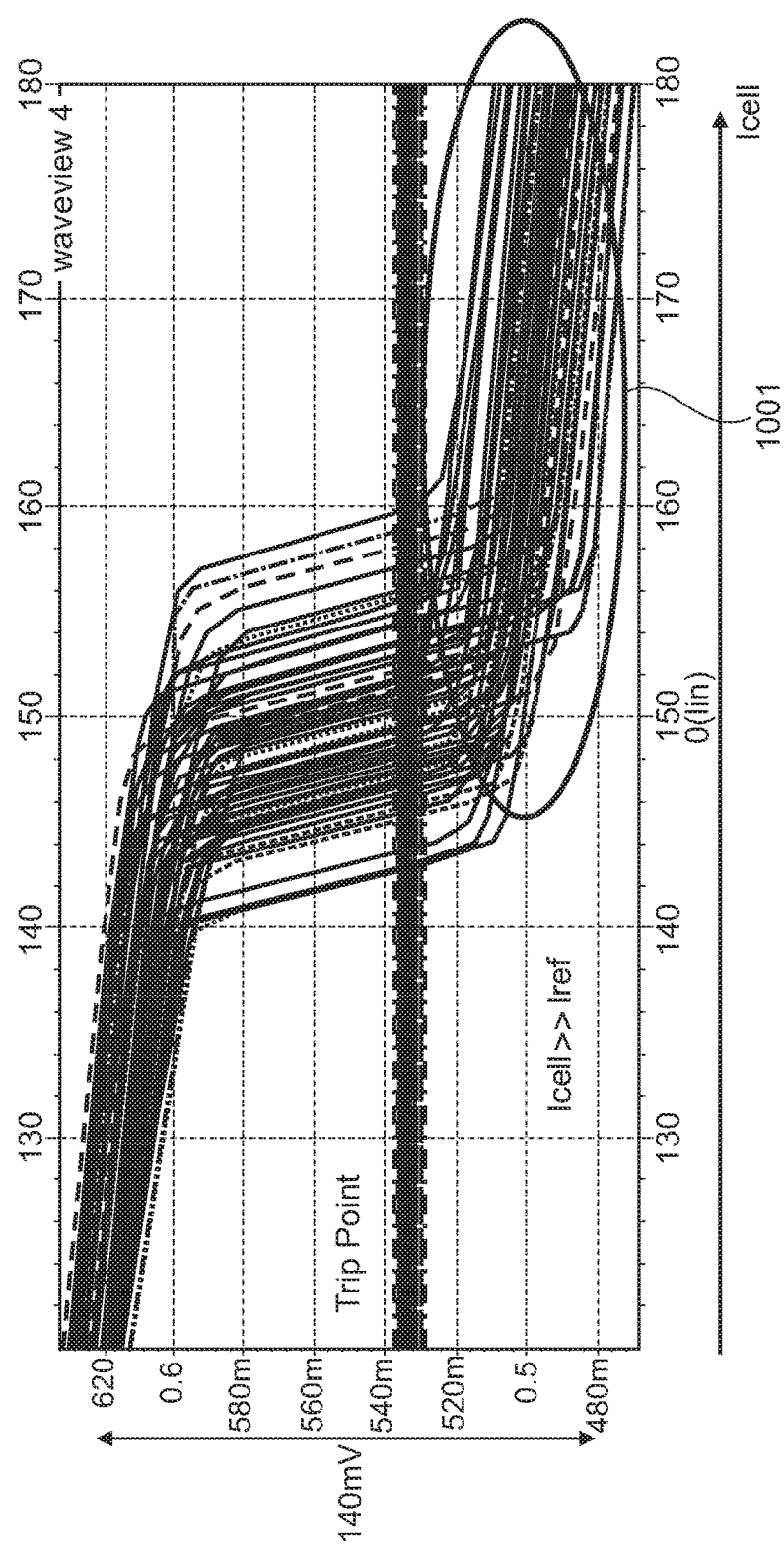
FIG. 10 shows illustrates the operating region of the sense amplifier for the case that the cell current is much higher than the reference current in the diagram of FIG. 4.

FIG. 10 illustrates the operating region 1001 for the case that the cell current is much higher than the reference current in the diagram of FIG. 4.

It should be noted that the location of the operating regions 801, 1001 and the strength of the limitation at node 816, 916, i.e. the slope of the potential at node 816, 916 in the operating regions 801, 1001 can be set by altering the dimensions of the field effect transistors forming the differential amplifiers 317, 318. For example, the potential at node 816, 916 is closer to the trip point level in the operating region 1001 than it is in the operating region 801. This can be achieved by a different dimensioning of the two differential amplifiers 317, 318, e.g. by a different width of the field effect transistors involved in the two differential amplifiers 317, 318.

Figure 11:
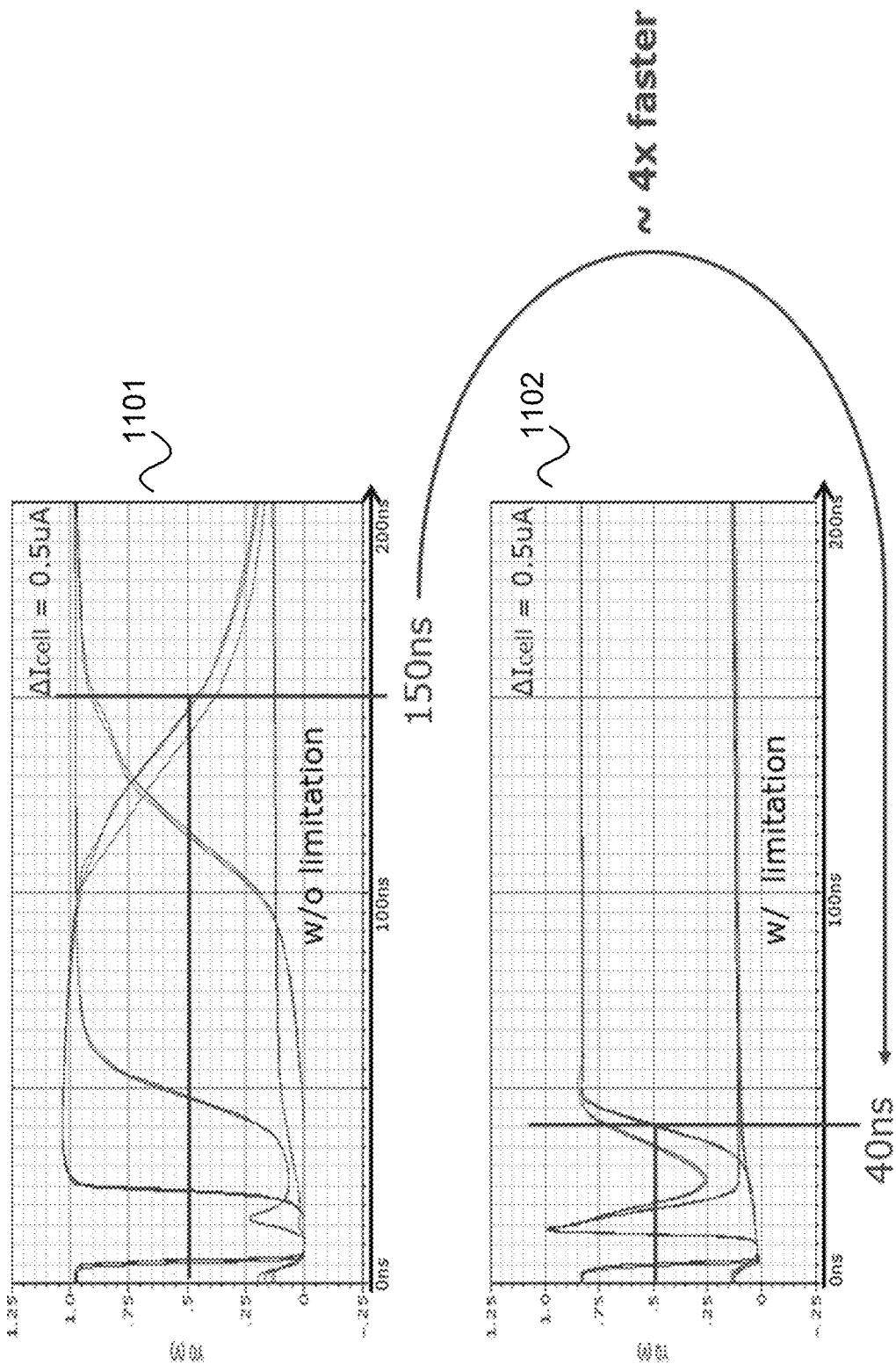
FIG. 11 shows gives a comparison of the access speed between the usage of a sense amplifier without potential limitation and the usage of a sense amplifier with potential limitation.

FIG. 11 gives a comparison of the access speed between the usage of a sense amplifier without limitation of the potential at node 316 and the usage of a sense amplifier with limitation of the potential at node 316 as realized by the sixth n channel field effect transistor 313 and the sixth p channel field effect transistor 314.

A first diagram 1101 shows the behavior of the output of the first differential amplifier 317 for various scenarios when a new memory cell is read without potential limitation at node 316 (old cell has stored value 1 and new cell has stored value 0, old cell has stored value 1 and new cell has stored value 0 etc.). As can be seen, in this example, only after 150 ns the output has the correct value for all cases.

A second diagram 1102 shows the behavior of the output of the first differential amplifier 317 for the scenarios with potential limitation at node 316. As can be seen, the output has the correct value for all cases already after 40 ns.

In other words the potential limitation at the internal node 316 of the sense amplifier 301 provides a considerable speed gain (of a factor of almost 4).

For both diagrams 1101, 1102 there is a difference in cell current of 0.5 µA between the states of the memory cell (i.e. between storing a logical 1 and storing a logical 0).

Figure 12:
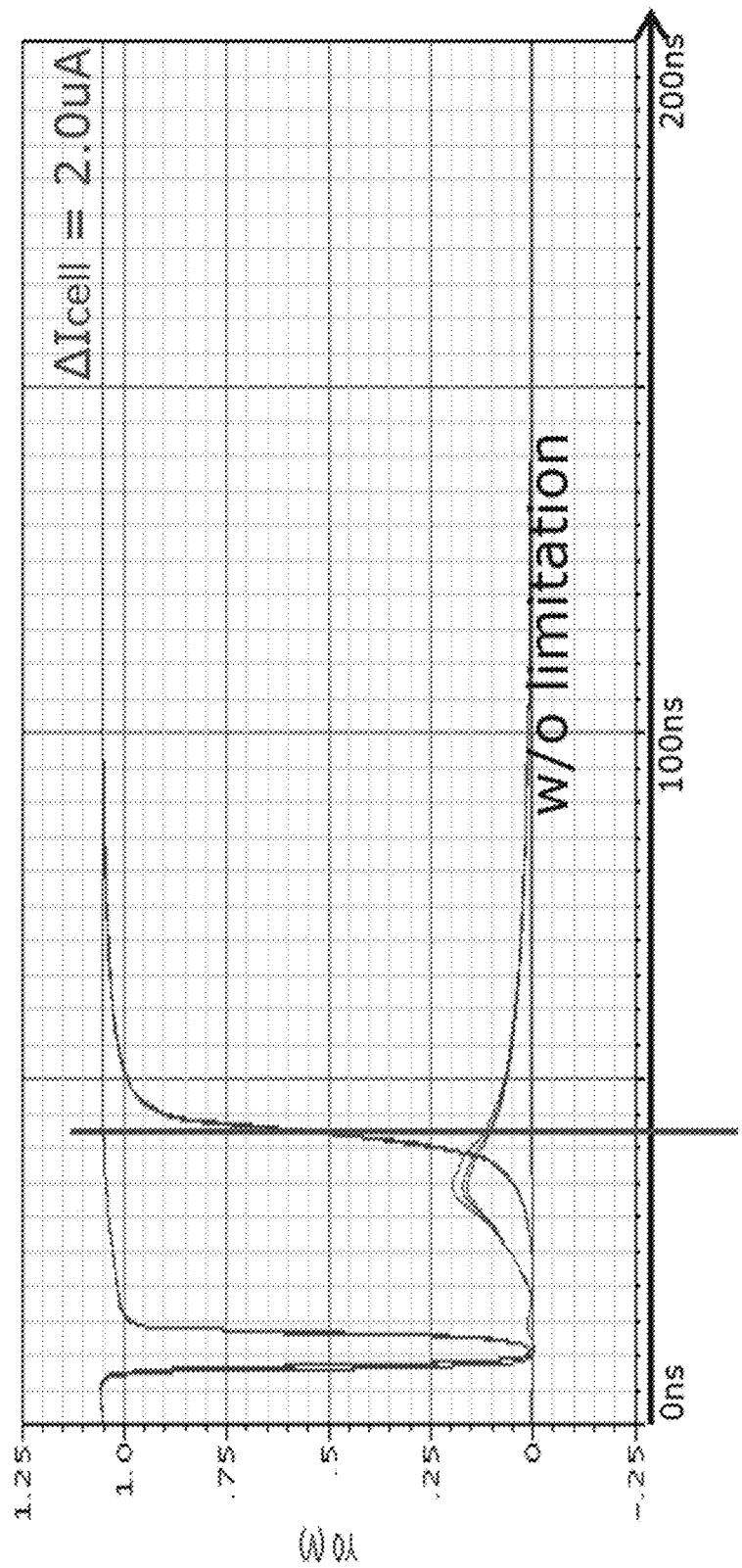
FIG. 12 shows a diagram illustrating that with potential limitation a much higher resolution can be achieved.

FIG. 12 shows a diagram 1200 illustrating that the time of 40 ns can be reached when a sense amplifier without limitation of the potential at node 316 is used when the difference in cell current is 2 µA. Since this is 4 times higher than what is required to achieve 40 ns (i.e. the same access time) with limitation (see FIG. 11), this shows that the limitation of the potential of node 316 provides, at the same access time a much higher sensitivity regarding the cell current and thus allows a higher resolution.

Figure 13:
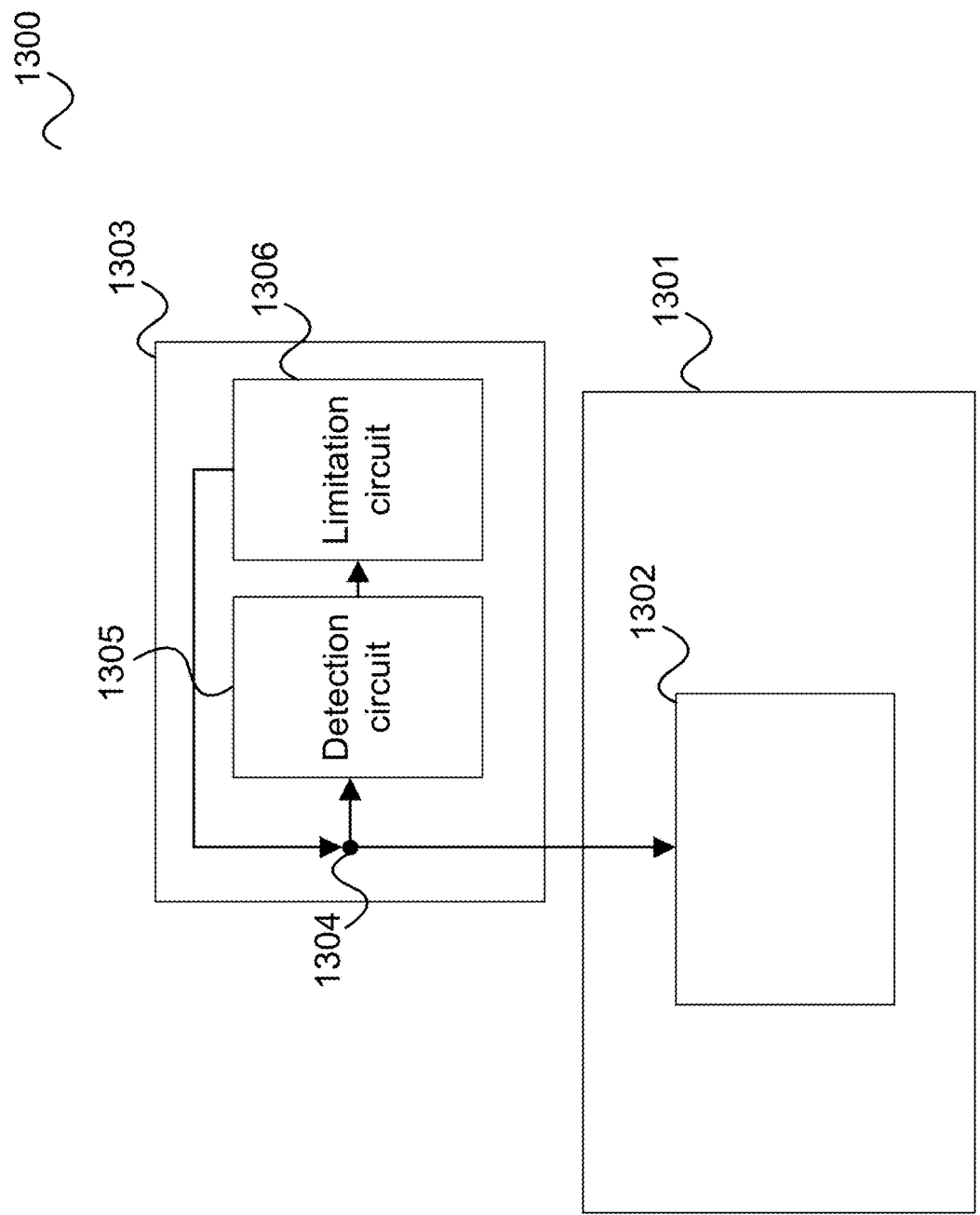
FIG. 13 shows a memory arrangement according to an embodiment.

In summary, according to various embodiments, a memory arrangement is provided as illustrated in FIG. 13.

FIG. 13 shows a memory arrangement 300 according to an embodiment.

The memory arrangement 300 includes a memory 1301 including a memory cell 1302 (e.g. of a multiplicity of memory cells of the memory 1301).

The memory arrangement 300 further includes a sense amplifier 1303 coupled to the memory cell 1302 including a node 1304 whose potential depends on the difference between a current through the memory cell 1302 and a (e.g. predetermined) reference current (or threshold current) and a detection circuit 1305 configured to generate a signal representing whether the current through the memory cell 1302 is above or below the reference current based on the potential of the node 1304.

The sense amplifier 1303 further include a limitation circuit 1306 configured to receive the signal and to limit the change of the potential of the node 1304 caused by the difference between the current through the memory cell 1302 and the reference current in response to the signal.

According to one embodiment, in other words, the potential at a node of a sense amplifier based on which the sense amplifier decides about the state of a memory cell (i.e. whether the memory cell stores a logical 1 or a logical 0) is limited in its variation when the sense amplifier has made the decision about the state of the memory cell. It should be noted that the limitation circuit may only react to the signal if it is a predetermined minimum level (i.e. it differs from a neutral level by a certain amount which may be different for the two cases of the cell current being below and the cell current being above the reference current). In other words, the signal only counts if it has a certain level. This can be seen as the limitation circuit only limiting the potential of the node after a decision has been taken (by the detection circuit), i.e. after the signal clearly indicates whether the cell current is above or below the reference current.

It should further be noted that the limitation circuit limiting the change of potential of the node may be understood as the limitation circuit counteracting the change of potential. For example, limiting the change of potential may not necessarily mean that the potential is limited to be below (or above) a fixed threshold. Instead, the potential may still depend on the difference between the cell current and the reference current, but, for example, the limitation circuit reduces the rate of change of the potential with changing difference between the cell current and the reference current.

The memory 1301 is for example a flash memory, e.g. as part of a chip card, i.e. arranged together with other components such as a processor in a chip card module on a chip card carrier.

In the following various embodiments are described.

Embodiment 1 is a memory arrangement as illustrated in FIG. 13.

Embodiment 2 is the memory arrangement of embodiment 1, wherein the node is a current summation node to which the reference current is supplied and from which the cell current is drained or from which the reference current is drained and to which the cell current is supplied and the limitation circuit is configured to limit the change of the potential of the node by draining or supplying a current of the size corresponding to the size of the difference between the reference current and the cell current via a bypass current path from or to the node, respectively.

Embodiment 3 is the memory arrangement of embodiment 1 or 2, wherein the limitation circuit is configured to, in response to the signal, supply current to the node if the current through the cell is above the reference current and to drain current from the node if the current through the cell is below the reference current.

Embodiment 4 is the memory arrangement of any one of embodiments 1 to 3, wherein the current through the memory cell is higher than the reference current if the memory cell stores a first logical value and the current through the memory cell is lower than the reference current if the memory cell stores a second logical value.

Embodiment 5 is the memory arrangement of embodiment 4, wherein the first logical value is a logical 1 and the second logical value is a logical 0 or wherein the first logical value is a logical 0 and the second logical value is a logical 1.

Embodiment 6 is the memory arrangement of any one of embodiments 1 to 5, wherein the sense amplifier is configured to generate an output which indicates whether the current through the memory cell is above or below the reference current based on the potential of the node.

Embodiment 7 is the memory arrangement of any one of embodiments 1 to 6, including an output circuit configured to generate the output based on the signal.

Embodiment 8 is the memory arrangement of any one of embodiments 1 to 7, wherein the detection circuit includes a differential amplifier receiving the potential of the node as a first input and receiving a reference potential corresponding to the reference current as a second input.

Embodiment 9 is the memory arrangement of embodiment 8, wherein the output of the differential amplifier is the signal.

Embodiment 10 is the memory arrangement of any one of embodiments 1 to 9, including a first differential amplifier receiving the potential of the node as a first input and receiving a reference potential corresponding to the reference current as a second input and a second differential amplifier receiving the potential of the node as a first input and receiving a reference potential corresponding to the reference current as a second input wherein the first differential amplifier is configured to trigger the limitation circuit to limit the change of the potential of the node caused by the difference between the current through the memory cell and the reference current when the current through the cell is above the reference current and the second differential amplifier is configured to trigger the limitation circuit to limit the change of the potential of the node caused by the difference between the current through the memory cell and the reference current when the current through the cell is below the reference current.

Embodiment 11 is the memory arrangement of embodiment 10, wherein the signal is the output of the first differential amplifier is configured or the signal is the output of the second differential amplifier.

Embodiment 12 is the memory arrangement of embodiment 10 or 11, wherein the first differential amplifier is configured to switch on a first switch of the limitation circuit when the current through the cell is above the reference current and the second differential amplifier is configured to switch on a second switch of the limitation circuit when the current through the cell is below the reference current.

Embodiment 13 is the memory arrangement of any one of embodiments 1 to 12, wherein the memory is a non-volatile memory.

Embodiment 14 is the memory arrangement of any one of embodiments 1 to 13, wherein the memory is a resistive random access memory.

Embodiment 15 is the memory arrangement of any one of embodiments 1 to 14, wherein the memory is a magnetroresistive random access memory.

Embodiment 16 is the memory arrangement of any one of embodiments 1 to 15, including a current source configured to supply the reference current to the node.

Embodiment 17 is the memory arrangement of any one of embodiments 1 to 16, wherein the node is connected to an input of the memory cell.

Embodiment 18 is the memory arrangement of any one of embodiments 1 to 17, wherein the node is connected to a bit line of the memory cell.

Embodiment 19 is the memory arrangement of any one of embodiments 1 to 18, wherein the detection circuit is configured to generate the signal to have a predetermined minimum level if the current through the memory cell is above or below the reference current by a predetermined margin.

Embodiment 20 is the memory arrangement of any one of embodiments 1 to 19, wherein the limitation circuit is configured to limit the change of the potential of the node in response to the signal if the level of the signal is above a predetermined level.

Embodiment 21 is the memory arrangement of any one of embodiments 1 to 20, wherein the limitation circuit is configured to limit the change of the potential of the node in response to the signal if the level of the signal is above a predetermined first level or below a predetermined second level.

Embodiment 22 is a method for reading a memory cell of a memory including generating a signal representing whether a current through the memory cell is above or below a reference current based on the potential of a node whose potential depends on the difference between a current through the memory cell and a reference current, receiving the signal and limiting the change of the potential of the node caused by the difference between the current through the memory cell and the reference current in response to the signal.

Embodiment 23 is the method of embodiment 22, wherein the node is a current summation node to which the reference current is supplied and from which the cell current is drained and the method comprises limiting the change of the potential of the node by draining or supplying a current of the size corresponding to the size of the difference between the reference current and the cell current via a bypass current path from or to the node, respectively.

Embodiment 24 is the embodiment of embodiment 22 or 23, comprising, in response to the signal, supplying current to the node if the current through the cell is above the reference current and draining current from the node if the current through the cell is below the reference current.

It should be noted that embodiments described in context of the memory arrangement of embodiment 1 are analogously valid for the method of embodiment 22.

Figure 14:
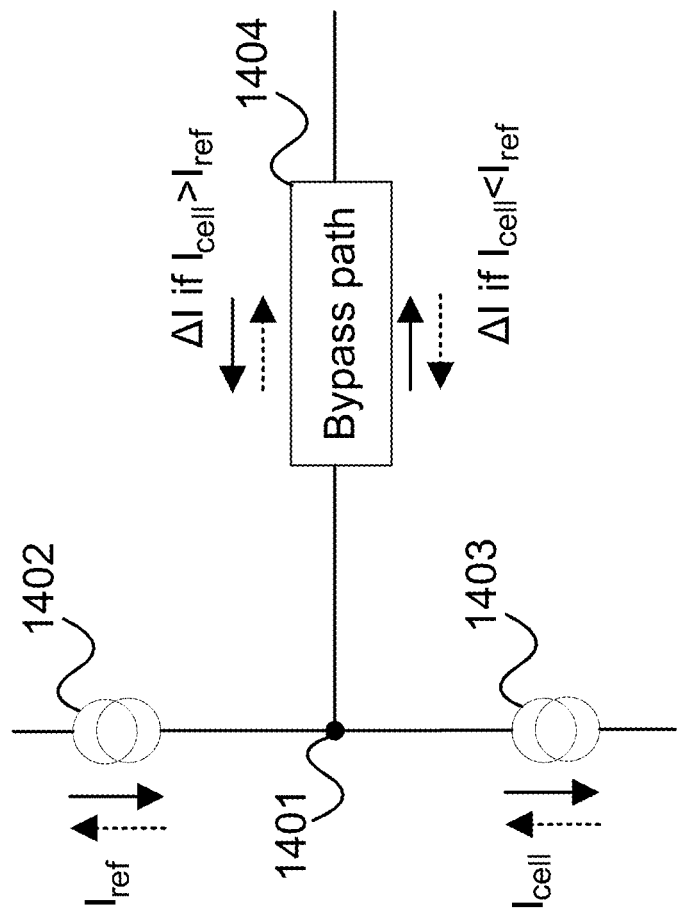
FIG. 14 shows illustrates the case of potential limitation by draining a current or supplying a current via a bypass path.

FIG. 14 illustrates the case that the limitation circuit 1306 limits the change of potential of the node 1304 by draining a current form the node 1304 or supplying a current to the node 1304, respectively, via a bypass path.

According to various embodiments, as e.g. described above, the reference current is supplied to the node 1401 (corresponding to node 1304) as illustrated by a first current source 1402 and the cell current is drained from the node as illustrated by a second current source 1403.

Depending on whether the reference current is higher or lower than the cell current, the difference current $\Delta I = |I_{ref} - I_{cell}|$, i.e. a current of the size corresponding to the size of the difference between reference current and cell current is drained from the node 1401 or supplied to the node 1401 via a bypass path 1404.

It should be noted that the directions of the reference current and the cell current as well as the respective directions of the current through the bypass path 1404 correspond to one example and may also be reversed in another embodiment as indicated by the dashed arrows in FIG. 14.

In other words, the limitation circuit balances the difference between the cell current and the reference current via an extra current path (i.e. the bypass path). This can be considered as the limitation circuit holding the node 1401 in (or near) a certain operating point when being outside the operating region 601 which can be seen as the detection range, i.e. the range where the actual detection takes place.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory arrangement comprising:
   a memory comprising a memory cell; and
   a sense amplifier coupled to the memory cell comprising
      a node whose potential depends on a difference between a current through the memory cell and a reference current;
      a detection circuit configured to generate a signal representing whether the current through the memory cell is above or below the reference current based on the potential of the node; and
      a limitation circuit configured to receive the signal and to limit a change of the potential of the node caused by the difference between the current through the memory cell and the reference current in response to the signal,
   wherein the node is a current summation node to which the reference current is supplied and from which the current through the memory cell is drained or from which the reference current is drained and to which the cell current is supplied and the limitation circuit is configured to limit the change of the potential of the node by draining or supplying a current corresponding to a size of the difference between the reference current and the cell current via a bypass current path from or to the node, respectively.

2. The memory arrangement of claim 1, wherein the limitation circuit is configured to, in response to the signal, supply current to the node if the current through the current through the memory cell is above the reference current and to drain current from the node if the current through the cell is below the reference current.

3. The memory arrangement of claim 1, wherein the current through the memory cell is higher than the reference current if the memory cell stores a first logical value and the current through the memory cell is lower than the reference current if the memory cell stores a second logical value.

4. The memory arrangement of claim 3, wherein the first logical value is a logical 1 and the second logical value is a logical 0 or wherein the first logical value is a logical 0 and the second logical value is a logical 1.

5. The memory arrangement of claim 1, wherein the sense amplifier is configured to generate an output which indicates whether the current through the memory cell is above or below the reference current based on the potential of the node.

6. The memory arrangement of claim 1, further comprising:
   an output circuit configured to generate an output based on the signal.

7. The memory arrangement of claim 1, wherein the detection circuit comprises a differential amplifier receiving the potential of the node as a first input and receiving a reference potential corresponding to the reference current as a second input.

8. The memory arrangement of claim 7, wherein an output of the differential amplifier is the signal.

9. The memory arrangement of claim 1, further comprising:
   a first differential amplifier receiving the potential of the node as a first input of the first differential amplifier and receiving a reference potential corresponding to the reference current as a second input of the first differential amplifier; and
   a second differential amplifier receiving the potential of the node as a first input of the second differential amplifier and receiving the reference potential corresponding to the reference current as a second input of the second differential amplifier;
   wherein the first differential amplifier is configured to trigger the limitation circuit to limit the change of the potential of the node caused by the difference between the current through the memory cell and the reference current when the current through the memory cell is above the reference current; and
   wherein the second differential amplifier is configured to trigger the limitation circuit to limit the change of the potential of the node caused by the difference between the current through the memory cell and the reference current when the current through the cell is below the reference current.

10. The memory arrangement of claim 9, wherein the signal is the output of the first differential amplifier or the signal is the output of the second differential amplifier.

11. The memory arrangement of claim 9, wherein the first differential amplifier is configured to switch on a first switch of the limitation circuit when the current through the memory cell is above the reference current and the second differential amplifier is configured to switch on a second switch of the limitation circuit when the current through the cell is below the reference current.

12. The memory arrangement of claim 1, wherein the memory is a non-volatile memory.

13. The memory arrangement of claim 1, wherein the memory is a resistive random access memory.

14. The memory arrangement of claim 1, wherein the memory is a magnetoresistive random access memory.

15. The memory arrangement of claim 1, further comprising:
a current source configured to supply the reference current to the node.

16. The memory arrangement of claim 1,
wherein the node is connected to an input of the memory cell.

17. The memory arrangement of claim 1,
wherein the node is connected to a bit line of the memory cell.

18. The memory arrangement of claim 1,
wherein the detection circuit is configured to generate the signal to have a predetermined minimum level if the current through the memory cell is above or below the reference current by a margin.

19. The memory arrangement of claim 1,
wherein the limitation circuit is configured to limit the change of the potential of the node in response to the signal if a level of the signal is above a predetermined level.

20. The memory arrangement of claim 1,
wherein the limitation circuit is configured to limit the change of the potential of the node in response to the signal if a level of the signal is above a predetermined first level or below a predetermined second level.

21. A method for reading a memory cell of a memory, the method comprising:
generating a signal representing whether a current through the memory cell is above or below a reference current based on a potential of a node whose potential depends on a difference between the current through the memory cell and the reference current;
receiving the signal and limiting a change of the potential of the node caused by the difference between the current through the memory cell and the reference current in response to the signal; and
limiting the change of the potential of the node by draining or supplying a current corresponding to a size of the difference between the reference current and the cell current via a bypass current path from or to the node, respectively;
wherein the node is a current summation node to which the reference current is supplied and from which the current through the memory cell is drained.

22. The method of claim 21, further comprising, in response to the signal:
supplying current to the node if the current through the memory cell is above the reference current; and
draining current from the node if the current through the cell is below the reference current.

23. A memory arrangement comprising:
a memory comprising a memory cell; and
a sense amplifier coupled to the memory cell comprising
a node whose potential depends on a difference between a current through the memory cell and a reference current;
a detection circuit configured to generate a signal representing whether the current through the memory cell is above or below the reference current based on the potential of the node; and
a limitation circuit configured to receive the signal and to limit a change of the potential of the node caused by the difference between the current through the memory cell and the reference current in response to the signal,
wherein the memory is a non-volatile memory.

* * * * *

UNITED STATES PATENT AND TRADEMARK OFFICE
CERTIFICATE OF CORRECTION

PATENT NO. : 10,134,452 B2
APPLICATION NO. : 15/421475
DATED : November 20, 2018
INVENTOR(S) : Ulrich Loibl Page 1 of 1

It is certified that error appears in the above-identified patent and that said Letters Patent is hereby corrected as shown below:

In the Claims

Column 11, Line 57-58, Claim 2: Please delete "if the current through the current through the memory cell" and write --if the current through the memory cell-- in place thereof.

Signed and Sealed this
Seventh Day of May, 2019

Andrei Iancu
*Director of the United States Patent and Trademark Office*